United States Patent
Kim et al.

(10) Patent No.: US 9,806,160 B2
(45) Date of Patent: Oct. 31, 2017

(54) POWER INTEGRATED DEVICES, ELECTRONIC DEVICES INCLUDING THE SAME, AND ELECTRONIC SYSTEMS INCLUDING THE SAME

(71) Applicant: SK hynix Inc., Gyeonggi-do (KR)

(72) Inventors: Dae Hoon Kim, Gyeonggi-do (KR); Sang Hyun Lee, Gyeonggi-do (KR)

(73) Assignee: SK HYNIX SYSTEM IC INC., Chungcheongbuk-Do (KR)

( * ) Notice: Subject to any disclaimer, the term of this patent is extended or adjusted under 35 U.S.C. 154(b) by 0 days.

(21) Appl. No.: 15/237,096

(22) Filed: Aug. 15, 2016

(65) Prior Publication Data

US 2016/0351707 A1 Dec. 1, 2016

Related U.S. Application Data

(63) Continuation of application No. 14/795,805, filed on Jul. 9, 2015.

(30) Foreign Application Priority Data

Feb. 17, 2015 (KR) .......................... 10-2015-0024488

(51) Int. Cl.
*H01L 29/40* (2006.01)
*H01L 29/78* (2006.01)
(Continued)

(52) U.S. Cl.
CPC ........ *H01L 29/402* (2013.01); *H01L 29/0653* (2013.01); *H01L 29/0847* (2013.01);
(Continued)

(58) Field of Classification Search
CPC ............... H01L 29/402; H01L 29/1095; H01L 29/42368; H01L 29/7835; H01L 29/0653;
(Continued)

(56) References Cited

U.S. PATENT DOCUMENTS

2006/0033155 A1* 2/2006 Wu .......................... H01L 21/74
257/335
2011/0198690 A1* 8/2011 Hu ......................... H01L 29/0653
257/336
(Continued)

*Primary Examiner* — Galina Yushina
(74) *Attorney, Agent, or Firm* — IP & T Group LLP

(57) ABSTRACT

A power integrated device includes a semiconductor layer having first conductivity, a source region and a drain region each having second conductivity and disposed in the semiconductor layer, wherein the source region and the drain region are spaced apart from each other, a first drift region having the second conductivity, disposed in the semiconductor layer, and surrounding the drain region, a second drift region having the second conductivity, disposed in the semiconductor layer, contacting a sidewall of the first drift region, and having an impurity concentration lower than an impurity concentration of the first drift region, a gate insulation layer disposed over a channel region between the source region and the second drift region and extending over the second drift region, a field insulation plate disposed over the second drift region and the first drift region, contacting a sidewall of the gate insulation layer, and having a planar structure, and a gate conductive pattern disposed over the gate insulation layer, wherein the gate conductive pattern extends over the field insulation plate.

11 Claims, 7 Drawing Sheets

(51) Int. Cl.
*H01L 29/08* (2006.01)
*H01L 29/10* (2006.01)
*H01L 29/423* (2006.01)
*H01L 29/06* (2006.01)

(52) U.S. Cl.
CPC ...... *H01L 29/7835* (2013.01); *H01L 29/0649* (2013.01); *H01L 29/1045* (2013.01); *H01L 29/1083* (2013.01); *H01L 29/1095* (2013.01); *H01L 29/42368* (2013.01)

(58) Field of Classification Search
CPC ............. H01L 29/0847; H01L 29/1045; H01L 29/1083; H01L 29/7816; H01L 29/66681
See application file for complete search history.

(56) References Cited

U.S. PATENT DOCUMENTS

| 2013/0020632 | A1* | 1/2013 | Disney | H01L 29/402 |
| | | | | 257/328 |
| 2014/0197489 | A1* | 7/2014 | Chu | H01L 29/7816 |
| | | | | 257/343 |
| 2015/0187931 | A1* | 7/2015 | Yoo | H01L 29/7816 |
| | | | | 257/339 |

* cited by examiner

POWER INTEGRATED DEVICES, ELECTRONIC DEVICES INCLUDING THE SAME, AND ELECTRONIC SYSTEMS INCLUDING THE SAME

CROSS-REFERENCE TO RELATED APPLICATION

This is a continuation application of U.S. present application Ser. No. 14/795,805 filed on Jul. 9, 2015 entitled POWER INTEGRATED DEVICES, ELECTRONIC DEVICES INCLUDING THE SAME, AND ELECTRONIC SYSTEMS INCLUDING THE SAME, which claims priority of Korean patent application number 10-2015-0024488 filed on Feb. 17, 2015. The disclosure of each of the foregoing applications is incorporated herein by reference in its entirety.

BACKGROUND

1. Technical Field

Various embodiments of the present disclosure relate to semiconductor integrated circuits and, more particularly, to power integrated devices, electronic devices including the same, and electronic systems including the same.

2. Related Art

Integrated circuits having functions of both a controller and a driver may be employed in smart power devices. Output circuits of the smart power devices may be designed to include Lateral Double diffused MOS (LDMOS) transistors operating at high voltages. Thus, breakdown voltages of the LDMOS transistors, for example, a drain junction breakdown voltage and a gate dielectric breakdown voltage, are important factors that may directly influence the stable operation of the LDMOS transistors. In addition, on-resistance (Ron) of the LDMOS transistors is also an important factor that may influence electrical characteristics of the LDMOS transistors, for example, current drivability of the LDMOS transistors. To improve the drain junction breakdown voltage of the LDMOS transistors, a doping concentration of a drift region between a drain region and a channel region should be reduced or a drift length of carriers in the drift region, corresponding to a length of a current path in the drift region, should be increased. However, in such a case, the current drivability of the LDMOS transistors may be degraded to increase the on-resistance (Ron) of the LDMOS transistors. On the contrary, if the doping concentration of the drift region between the drain region and the channel region increases or the drift length in the drift region decreases, the on-resistance (Ron) of the LDMOS transistors may be reduced to improve the current drivability of the LDMOS transistors but the drain junction breakdown voltages of the LDMOS transistors may be lowered. That is, in the LDMOS transistors, the on-resistance and the drain junction breakdown voltage may have a trade-off relationship.

SUMMARY

Various embodiments are directed to power integrated devices, electronic devices including the same, and electronic systems including the same.

According to an embodiment, a power integrated device includes a semiconductor layer having first conductivity, a source region and a drain region each having second conductivity and disposed in the semiconductor layer, wherein the source region and the drain region are spaced apart from each other, a first drift region having the second conductivity, disposed in the semiconductor layer, and surrounding the drain region, a second drift region having the second conductivity, disposed in the semiconductor layer, contacting a sidewall of the first drift region, and having an impurity concentration lower than an impurity concentration of the first drift region, a gate insulation layer disposed over a channel region between the source region and the second drift region and extending over the second drift region, a field insulation plate disposed over the second drift region and the first drift region, contacting a sidewall of the gate insulation layer, and having a planar structure, and a gate conductive pattern disposed over the gate insulation layer, wherein the gate conductive pattern extends over the field insulation plate.

According to another embodiment, a power integrated device includes a semiconductor layer having first conductivity, a source region having second conductivity, a drift region having the second conductivity, disposed in the semiconductor layer, and spaced apart from the source region by a channel region, a drain region having the second conductivity and disposed in an upper portion of the drift region, a gate insulation layer disposed over the channel region and extending over the drift region, a first field insulation plate disposed over the drift region, contacting a sidewall of the gate insulation layer, and having a planar structure, a second field insulation plate extending from under the first field insulation plate into the drift region and having a trench structure, and a gate conductive pattern disposed over the gate insulation layer, wherein the gate conductive pattern extends over the first field insulation plate.

According to another embodiment, an electronic device includes a high voltage integrated circuit and a power integrated device. The high voltage integrated circuit is suitable for generating an output signal in response to an input signal. The power integrated device is suitable for executing a switching operation according to the output signal of the high voltage integrated circuit. The power integrated device includes a semiconductor layer having first conductivity, a source region and a drain region each having second conductivity and disposed in the semiconductor layer, wherein the source region and the drain region are spaced apart from each other, a first drift region having the second conductivity, disposed in the semiconductor layer, and surrounding the drain region, a second drift region having the second conductivity, disposed in the semiconductor layer, contacting a sidewall of the first drift region, and having an impurity concentration lower than an impurity concentration of the first drift region, a gate insulation layer disposed over a channel region between the source region and the second drift region and extending over the second drift region, a field insulation plate disposed over the second drift region and the first drift region, contacting a sidewall of the gate insulation layer, and having a planar structure, and a gate conductive pattern disposed over the gate insulation layer, wherein the gate conductive pattern extends over the field insulation plate.

According to another embodiment, an electronic device includes a high voltage integrated circuit and a power integrated device. The high voltage integrated circuit is suitable for generating an output signal in response to an input signal. The power integrated device is suitable for executing a switching operation according to the output signal of the high voltage integrated circuit. The power integrated device includes a semiconductor layer having first conductivity, a source region having second conductivity, a drift region having the second conductivity, disposed in the semiconductor layer, and spaced apart from the source region by a channel region, a drain region having the second conductivity and disposed in an upper portion of the drift region, a gate insulation layer disposed over the channel region and extending over the drift region, a first field insulation plate disposed over the drift region, contacting a sidewall of the gate insulation layer, and having a planar structure, a second field insulation plate extending from under the first field insulation plate into the drift region and having a trench structure, and a gate conductive pattern disposed over the gate insulation layer, wherein the gate conductive pattern extends over the first field insulation plate.

According to another embodiment, an electronic system includes a mobile station modem (MSM), a radiofrequency (RF) subsystem, a display, a memory and a power management integrated circuit (PMIC) that is configured to include a power integrated device and to supply a power supply voltage to the MSM, the RF subsystem and the display. The power integrated device includes a semiconductor layer having first conductivity, a source region and a drain region each having second conductivity and disposed in the semiconductor layer, wherein the source region and the drain region are spaced apart from each other, a first drift region having the second conductivity, disposed in the semiconductor layer, and surrounding the drain region, a second drift region having the second conductivity, disposed in the semiconductor layer, contacting a sidewall of the first drift region, and having an impurity concentration lower than an impurity concentration of the first drift region, a gate insulation layer disposed over a channel region between the source region and the second drift region and extending over the second drift region, a field insulation plate disposed over the second drift region and the first drift region, contacting a sidewall of the gate insulation layer, and having a planar structure, and a gate conductive pattern disposed over the gate insulation layer, wherein the gate conductive pattern extends over the field insulation plate.

According to another embodiment, an electronic system includes a mobile station modem (MSM), a radiofrequency (RF) subsystem, a display, a memory and a power management integrated circuit (PMIC) that is configured to include a power integrated device and to supply a power supply voltage to the MSM, the RF subsystem and the display. The power integrated device includes a semiconductor layer having first conductivity, a source region having second conductivity, a drift region having the second conductivity, disposed in the semiconductor layer, and spaced apart from the source region by a channel region, a drain region having the second conductivity and disposed in an upper portion of the drift region, a gate insulation layer disposed over the channel region and extending over the drift region, a first field insulation plate disposed over the drift region, contacting a sidewall of the gate insulation layer, and having a planar structure, a second field insulation plate extending from under the first field insulation plate into the drift region and having a trench structure, and a gate conductive pattern disposed over the gate insulation layer, wherein the gate conductive pattern extends over the first field insulation plate.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In power integrated devices such as LDMOS transistors, a field insulation plate formed by a local oxidation of silicon (LOCOS) process may be employed as a gate dielectric layer and a gate electrode may extend onto the field insulation plate. According to this gate structure, a drain electric field may be lowered and a gate modulation phenomenon due to a drain structure may be suppressed. However, if the LOCOS field insulation plate is employed in the power integrated devices, there may be some limitations in reducing a size of the power integrated devices or in increasing a drain junction breakdown voltage. In particular, as the power integrated devices become more highly integrated, a distance between a drain region and a source region has been reduced. In such a case, an electric field across a metallurgical junction such as a drain junction may increase. In addition, if the power integrated devices are scaled down to increase the integration density thereof, a curvature radius of the metallurgical junction that is, the drain junction may be reduced to increase an electric field across the metallurgical junction. As a result, a breakdown voltage characteristic of the metallurgical junction may be degraded. Moreover, the LOCOS field insulation plate may lead to a difficulty in control of a channel length of the power integrated devices. Accordingly, the following embodiments may provide various power integrated devices which are capable of improving an on-resistance characteristic and a breakdown voltage characteristic even without using the LOCOS field insulation plate.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
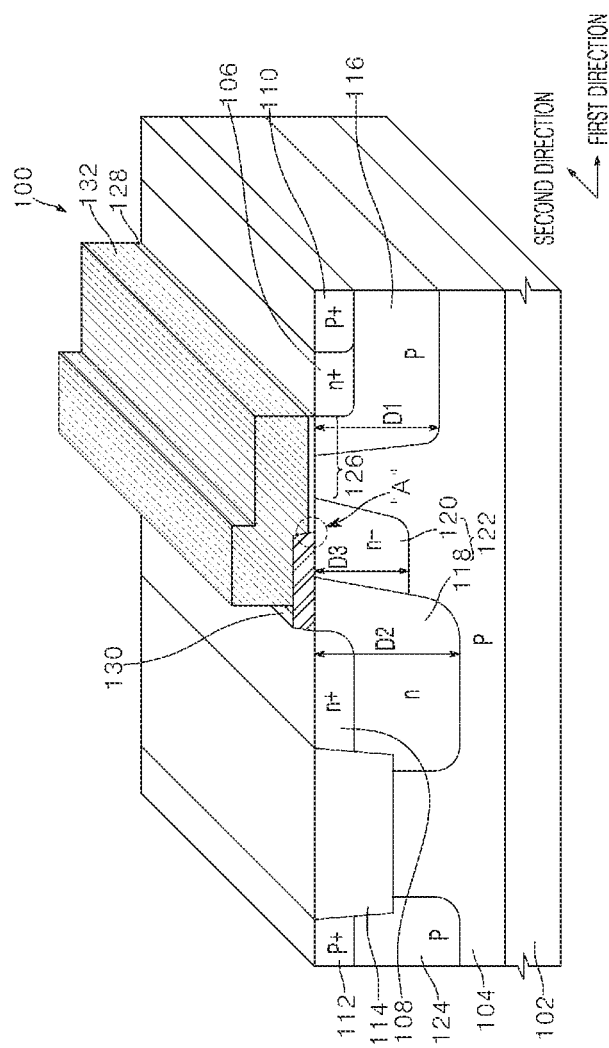
FIG. 1 is a perspective view illustrating a power integrated device according to an embodiment.

FIG. 1 is a perspective view illustrating a power integrated device 100 according to an embodiment. Referring to FIG. 1, the power integrated device 100 may include a semiconductor layer 104 of a first conductivity type, for example, a P-type semiconductor layer which is disposed on a substrate 102. In some embodiments, the P-type semiconductor layer 104 may be a material layer grown by an epitaxial process. Alternatively, the P-type semiconductor layer 104 may be provided by implanting impurity ions into a semiconductor substrate. If the substrate 102 is a semiconductor substrate having the first conductivity type that is, the P-type, the substrate 102 may serve as the P-type semiconductor layer 104. The P-type semiconductor layer 104 may be a silicon layer.

A source region 106 and a drain region 108 heavily doped with impurities of a second conductivity type, for example, an N-type source region and an N-type drain region may be disposed in an upper portion of the P-type semiconductor layer 104 spaced apart from each other in a first direction. Each of the N-type source region 106 and the N-type drain region 108 may extend in a second direction intersecting the first direction to have a stripe shape.

A body contact region 110 heavily doped with P-type impurities may be disposed at one side of the N-type source region 106. One sidewall of the N-type source region 106 may be in contact with one sidewall of the P-type body contact region 110.

A contact region 112 heavily doped with P-type impurities may be disposed in an upper portion of the P-type semiconductor layer 104 spaced apart from the N-type drain region 108 in the first direction.

A trench isolation layer 114 may be disposed between the P-type contact region 112 and the N-type drain region 108. The trench isolation layer 114 may be disposed to electrically isolate some impurity junction regions constituting the power integrated device 100 from each other.

The N-type source region 106 and the P-type body contact region 110 may be surrounded by a P-type body region 116 that is disposed in the P-type semiconductor layer 104. The P-type body region 116 may have a first junction depth D1. The N-type drain region 108 may be surrounded by the trench isolation layer 114 and a drift region 122. The drift region 122 is disposed in the P-type semiconductor layer 104 to have the same conductivity type as the N-type drain region 108. The P-type contact region 112 may be surrounded by a well region 124 that is disposed in the P-type semiconductor layer 104 to have the same conductivity type as the P-type contact region 112.

The drift region 122 may include a first N-type drift region 118 and a second N-type drift region 120. The first N-type drift region 118 may be disposed in an upper portion of the P-type semiconductor layer 104 to surround sidewalls and a bottom surface of the N-type drain region 108 and to have a second junction depth D2. The second N-type drift region 120 may be disposed in an upper portion of the P-type semiconductor layer 104 in contact with one sidewall of the first N-type drift region 118 and spaced apart from the P-type body region 116 in the first direction.

The second N-type drift region 120 may have a third junction depth D3. The third junction depth D3 may be less than the second junction depth D2. The first junction depth D1 of the P-type body region 116 may be less than the second junction depth D2 and may be greater than the third junction depth D3.

An impurity concentration of the first N-type drift region 118 may be lower than an impurity concentration of the N-type drain region 108. An impurity concentration of the second N-type drift region 120 may be lower than an impurity concentration of the first N-type drift region 118. An upper portion of the P-type semiconductor layer 104 between the N-type source region 106 and the second N-type drift region 120 may correspond to a channel region 126.

A gate insulation layer 128 may be disposed on the channel region 126 between the N-type source region 106 and the second N-type drift region 120. The gate insulation layer 128 may extend onto the second N-type drift region 120 by a certain length.

A field insulation plate 130 may be disposed on a top surface of the first N-type drift region 118 and a top surface of the second N-type drift region 120. The field insulation plate 130 may have a planar structure. That is, a bottom surface of the field insulation plate 130 may be located at the same horizontal level as the top surface of the first N-type drift region 118 and the top surface of the second N-type drift region 120, and the field insulation plate 130 may upwardly protrude from the top surfaces of the first and second N-type drift regions 118 and 120 to have a certain height. One sidewall of the field insulation plate 130 may contact one sidewall of the gate insulation layer 128. The field insulation plate 130 is thicker than the gate insulation layer 128.

In some embodiments, a sidewall of the field insulation plate 130 opposite to the gate insulation layer 128 may be vertically aligned with a sidewall of the N-type drain region 108. Alternatively, the field insulation plate 130 may laterally extend onto a top surface of the N-type drain region 108 to overlap with a portion of the N-type drain region 108. In some embodiments, the field insulation plate 130 may include an oxide layer.

A gate conductive layer 132 may be disposed on the gate insulation layer 128. Thus, the gate conductive layer 132 may vertically overlap with an entire portion of the channel region 126 and a portion of the second N-type drift region 120 adjacent to the channel region 126. A sidewall of the gate conductive layer 132 may be self-aligned with a sidewall of the N-type source region 106 adjacent to the channel region 126. The gate conductive layer 132 may extend onto a top surface of the field insulation plate 130 to cover a portion of the field insulation plate 130. Thus, the gate conductive layer 132 may also vertically overlap with the remaining portion of the second N-type drift region 120 and a portion of the first N-type drift region 118 adjacent to the second N-type drift region 120.

Since the field insulation plate 130 has a planar structure, a current path from the N-type drain region 108 toward the N-type source region 106 may be reduced, improving an on-resistance characteristic of the power integrated device 100 as compared with a general integrated device employing a LOCOS field insulation plate. Moreover, the field insulation plate 130 may reduce an electric field that is concentrated at an edge of the gate insulation layer 128. (See portion "A" of FIG. 1) Accordingly, a breakdown position of the power integrated device 100 may be distributed from the edge "A" of the gate insulation layer 128 into a bulk region of the power integrated device 100, thereby improving a breakdown characteristic of the power integrated device 100.

Nevertheless, an electric field may be applied to the edge or an interface between the gate insulation layer 128 according to design parameters of the power integrated device 100, for example, a junction depth of the drift region 122 or the like. (See portion "A" of FIG. 1) In such a case, even though the planar field insulation plate 130 is employed in the power integrated device 100, a breakdown phenomenon may occur in the interface region between the gate insulation layer 128 and the field insulation plate 130 before a breakdown phenomenon occurs in a bulk region of the power integrated device 100.

However, according to an embodiment, this effect may be alleviated or suppressed by employing the second N-type drift region 120 having a relatively low impurity concentration and disposed under the interface region between the gate insulation layer 128 and the field insulation plate 130.

In addition, the first N-type drift region 118 having a relatively high impurity concentration may be disposed to surround the N-type drain region 108. Thus, the first N-type drift region 118 may compensate for the increase of the on-resistance value which is due to the second N-type drift region 120 having a relatively low impurity concentration. In some embodiments, an impurity concentration of the second N-type drift region 120 may be within the range of about 40% to about 70% of an impurity concentration of the first N-type drift region 118. The impurity concentration in the vicinity of an interface between the first and second N-type drift regions 118 and 120 may exhibit a graded profile. That is, the impurity concentration may be gradually reduced from the first N-type drift region 118 toward the second N-type drift region 120.

Figure 2:
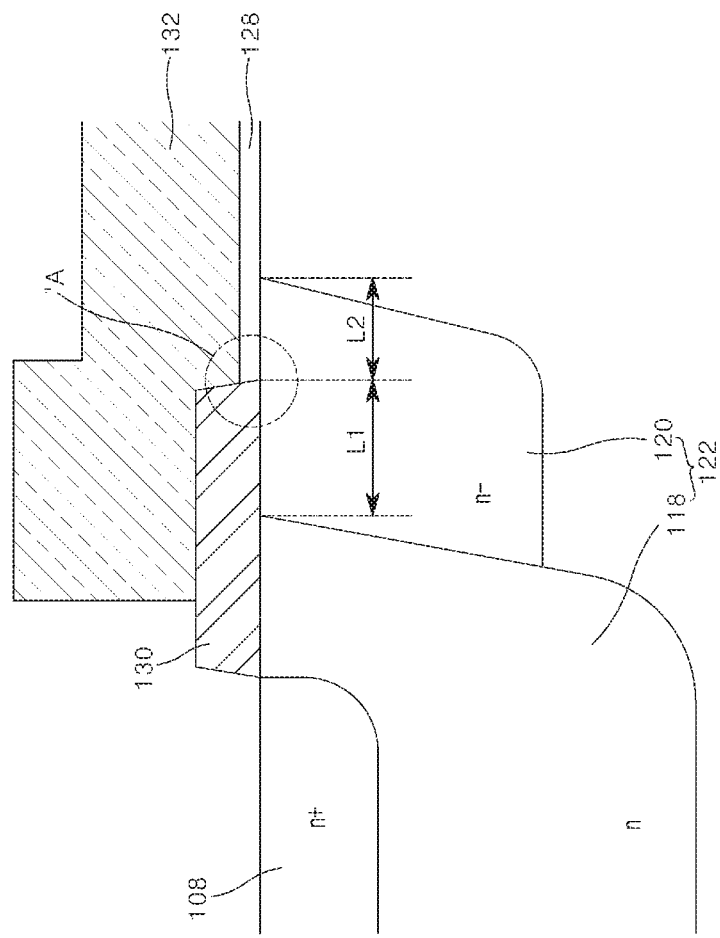
FIG. 2 is an enlarged cross-sectional view illustrating a field insulation plate portion of the power integrated device shown in FIG. 1.

FIG. 2 is an enlarged cross-sectional view illustrating the field insulation plate 130 and some regions adjacent to the field insulation plate 130 shown in FIG. 1. In FIG. 2, the same reference numerals as used in FIG. 1 denote the same elements. As illustrated in FIG. 2, the edge or the interface portion "A" between the gate insulation layer 128 and the field insulation plate 130 may be disposed on the second N-type drift region 120, and an electric field may be concentrated at the interface portion "A".

The second N-type drift region 120 may have a relatively low impurity concentration to alleviate an electric field concentration in the interface portion "A". The first N-type drift region 118 having a relatively high impurity concentration may be spaced apart from the interface portion "A" by a sufficient distance to alleviate an electric field concentration in the interface portion "A". Thus, even though the impurity concentration of the first N-type drift region 118 increases, the electric field concentration in the interface portion "A" may not be influenced by the impurity concentration of the first N-type drift region 118.

In some embodiments, a distance L1 corresponding to a length of an overlap region between the second N-type drift region 120 and the field insulation plate 130 in the first direction, between the first N-type drift region 118 and the interface portion "A" may be substantially equal to or greater than a length L2 of an overlap region between the second N-type drift region 120 and the gate insulation layer 128. That is, a distance corresponding to the length L1, from the first drift region 118 to the interface portion "A" between the gate insulation layer 128 and the field insulation plate 130 is substantially equal to or greater than a distance corresponding to the length L2, measured from the channel region 126 to the interface portion "A" between the gate insulation layer 128 and the field insulation plate 130.

Figure 3:
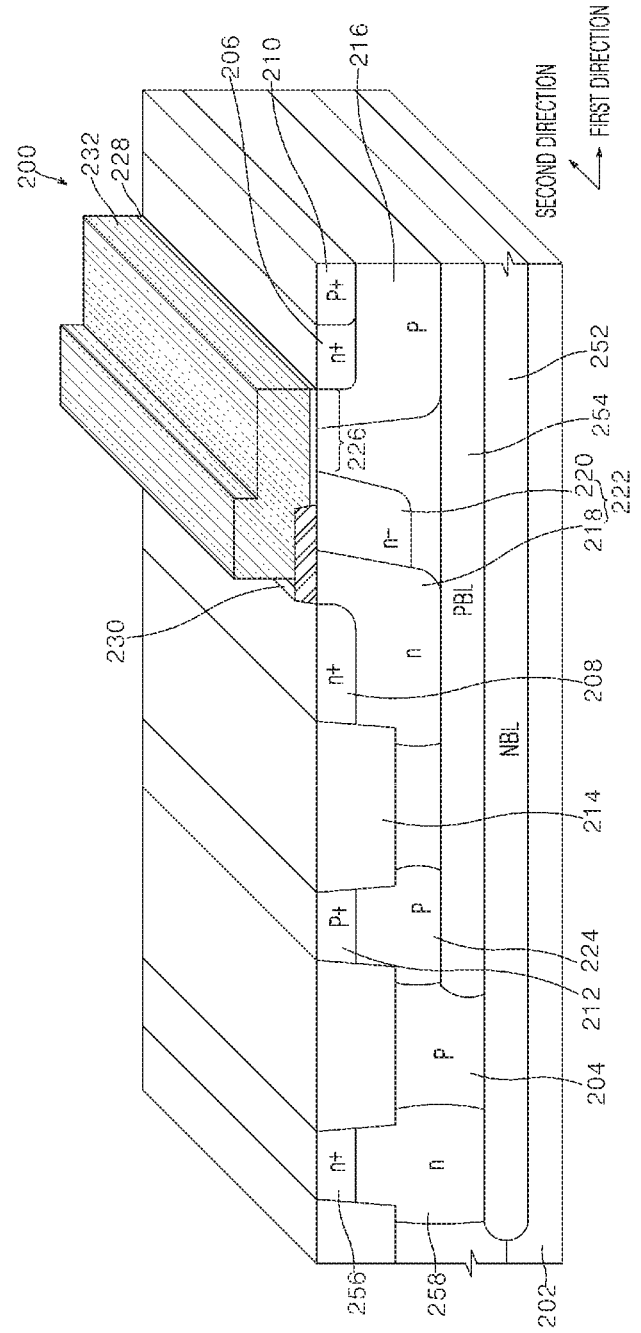
FIG. 3 is a perspective view illustrating a power integrated device according to another embodiment.

FIG. 3 is a perspective view illustrating a power integrated device 200 according to another embodiment. Referring to FIG. 3, the power integrated device 200 may include a semiconductor layer 204 of a first conductivity type, for example, a P-type semiconductor layer which is disposed on a substrate 202. In some embodiments, the P-type semiconductor layer 204 may be a material layer grown by an epitaxial process. Alternatively, the P-type semiconductor layer 204 may be provided by implanting impurity ions into a semiconductor substrate. The P-type semiconductor layer 204 may be a silicon layer.

A buried layer 252 heavily doped with impurity ions of a second conductivity type, for example, an N-type buried layer may be disposed between the substrate 202 and the P-type semiconductor layer 204. Impurities of the N-type buried layer 252 may be diffused into both of the substrate 202 and the P-type semiconductor layer 204.

A P-type buried layer 254 may be disposed in the P-type semiconductor layer 204 to cover the N-type buried layer 252. A bottom surface of the P-type buried layer 254 may contact a top surface of the N-type buried layer 252. A length of the N-type buried layer 252 in a first direction may be greater than a length of the P-type buried layer 254 in the first direction. Accordingly, one end of the N-type buried layer 252 may laterally protrude from one end of the P-type buried layer 254. Although not shown in FIG. 3, the other end of the N-type buried layer 252 may also laterally protrude from the other end of the P-type buried layer 254.

A source region 206 and a drain region 208 heavily doped with impurities of a second conductivity type, for example, an N-type source region and an N-type drain region may be disposed in an upper portion of the P-type semiconductor layer 204 spaced apart from each other in the first direction. Each of the N-type source region 206 and the N-type drain region 208 may extend in a second direction intersecting the first direction to have a stripe shape.

A body contact region 210 heavily doped with P-type impurities may be disposed at one side of the N-type source region 206. One sidewall of the N-type source region 206 may contact one sidewall of the P-type body contact region 210.

A contact region 212 heavily doped with P-type impurities and a contact region 256 heavily doped with N-type impurities may be disposed in an upper portion of the P-type semiconductor layer 204. The P-type contact region 212 may be spaced apart from the N-type drain region 208 in the first direction. The N-type contact region 256 may be spaced apart from the P-type contact region 212 in the first direction.

A trench isolation layer 214 may be disposed between the P-type contact region 212 and the N-type drain region 208 as well as between the P-type contact region 212 and the N-type contact region 256. The trench isolation layer 214 may be disposed to electrically isolate the power integrated device 200 from other devices formed in other regions of the substrate 202. In addition, the trench isolation layer 214 may be disposed to electrically isolate some impurity junction regions constituting the power integrated device 200 from each other.

The N-type source region 206 and the P-type body contact region 210 may be surrounded by a P-type body region 216 that is disposed in the P-type semiconductor layer 104. The N-type drain region 208 may be surrounded by the trench isolation layer 214 and a drift region 222. The drift region 222 is disposed in the P-type semiconductor layer 204 to have the same conductivity type as the N-type drain region 208. The P-type contact region 212 may be surrounded by a well region 224 that is disposed in the P-type semiconductor layer 204 to have the same conductivity type as the P-type contact region 212. Bottom surfaces of the P-type body contact region 216 and the P-type well region 224 may contact a top surface of the P-type buried layer 254. The N-type contact region 256 may be surrounded by an N-type sink region 258. A bottom surface of the N-type sink region 258 may contact a top surface of the N-type buried layer 252.

The drift region 222 may include a first N-type drift region 218 and a second N-type drift region 220. The first N-type drift region 218 may be disposed in an upper portion of the P-type semiconductor layer 204 to surround sidewalls and a bottom surface of the N-type drain region 208, and a bottom surface of the first N-type drift region 218 may contact a top surface of the P-type buried layer 254.

The second N-type drift region 220 may be disposed in an upper portion of the P-type semiconductor layer 204 to contact one sidewall of the first N-type drift region 218 and spaced apart from the P-type body region 216 by a certain distance in the first direction. A bottom surface of the second N-type drift region 220 may be spaced apart from a top surface of the P-type buried layer 254 by a certain distance. Alternatively, the bottom surface of the second N-type drift region 220 may contact the top surface of the P-type buried layer 254.

An impurity concentration of the first N-type drift region 218 may be lower than an impurity concentration of the N-type drain region 208. An impurity concentration of the second N-type drift region 220 may be lower than an impurity concentration of the first N-type drift region 218. An upper portion of the P-type semiconductor layer 204 between the N-type source region 206 and the second N-type drift region 220 may correspond to a channel region 226.

A gate insulation layer 228 may be disposed on the channel region 226 between the N-type source region 206 and the second N-type drift region 220. The gate insulation layer 228 may extend onto the second N-type drift region 220 by a certain length.

A field insulation plate 230 may be disposed on a top surface of the first N-type drift region 218 and a top surface of the second N-type drift region 220. The field insulation plate 230 may have a planar structure. That is, a bottom surface of the field insulation plate 230 may be located at the same horizontal level as the top surface of the first N-type drift region 218 and the top surface of the second N-type drift region 220, and the field insulation plate 230 may upwardly protrude from the top surfaces of the first and second N-type drift regions 218 and 220 to have a certain height. One sidewall of the field insulation plate 230 may contact one sidewall of the gate insulation layer 228.

In some embodiments, a sidewall of the field insulation plate 230 opposite to the gate insulation layer 228 may be vertically aligned with a sidewall of the N-type drain region 208. Alternatively, the field insulation plate 230 may laterally extend onto a top surface of the N-type drain region 208 to overlap with a portion of the N-type drain region 208. In some embodiments, the field insulation plate 230 may include an oxide layer.

A gate conductive layer 232 may be disposed on the gate insulation layer 228. Thus, the gate conductive layer 232 may vertically overlap with an entire portion of the channel region 226 and a portion of the second N-type drift region 220 adjacent to the channel region 226. A sidewall of the gate conductive layer 232 may be self-aligned with a sidewall of the N-type source region 206 adjacent to the channel region 226. The gate conductive layer 232 may extend onto a top surface of the field insulation plate 230 to cover a portion of the field insulation plate 230. Thus, the gate conductive layer 232 may also vertically overlap with the remaining portion of the second N-type drift region 220 and a portion of the first N-type drift region 218 adjacent to the second N-type drift region 220.

As described with reference to FIGS. 1 and 2, the second N-type drift region 220 having a relatively low impurity concentration may be disposed under the interface region between the gate insulation layer 228 and the field insulation plate 230 to suppress an electric field concentration at the interface region between the gate insulation layer 228 and the field insulation plate 230. In addition, the first N-type drift region 218 having a relatively high impurity concentration may be disposed to surround the N-type drain region 208. Thus, the first N-type drift region 218 may compensate for the increase of the on-resistance value which is due to the second N-type drift region 220 having a relatively low impurity concentration.

In some embodiments, an impurity concentration of the second N-type drift region 220 may be within the range of about 40% to about 70% of an impurity concentration of the first N-type drift region 218. The impurity concentration in the vicinity of an interface between the first and second N-type drift regions 218 and 220 may exhibit a graded profile. That is, the impurity concentration may be gradually reduced from the first N-type drift region 218 toward the second N-type drift region 220.

In the meantime, since the first N-type drift region 218 surrounding the N-type drain region 208 has a relatively high impurity concentration, a breakdown characteristic in the bulk region of the power integrated device 200 may be degraded. This may be due to a depletion region in the first N-type drift region 218 is not instantaneously expanded or spread out due to the relatively high impurity concentration of the first N-type drift region 218.

In a conventional device, when a drain bias is applied to the N-type drain region 208, an electric field over a critical field corresponding to a breakdown voltage, may be created across the junction of the first N-type drift region 218 before the N-type drift region 218 is fully depleted. However, according to an embodiment, a bottom surface of the first N-type drift region 218 may contact a top surface of the P-type buried layer 254. Thus, the first N-type drift region 218 may be fully depleted under a certain bias condition.

For example, when the P-type contact region 212 and the body contact region 210 are grounded and a positive drain voltage is applied to the N-type drain region 208, a reverse bias may be applied across a junction between the P-type buried layer 254 and the first N-type drift region 218. Thus, both of the P-type buried layer 254 and the first N-type drift region 218 may be depleted in the vicinity of the junction therebetween. Therefore, the first N-type drift region 218 may be depleted in the vicinity of the junction between the first N-type drift region 218 and the P-type buried layer 254 as well as in the vicinity of the junction between the first N-type drift region 218 and the P-type semiconductor layer 204. As a result, the first N-type drift region 218 may be instantaneously and fully depleted.

Figure 4:
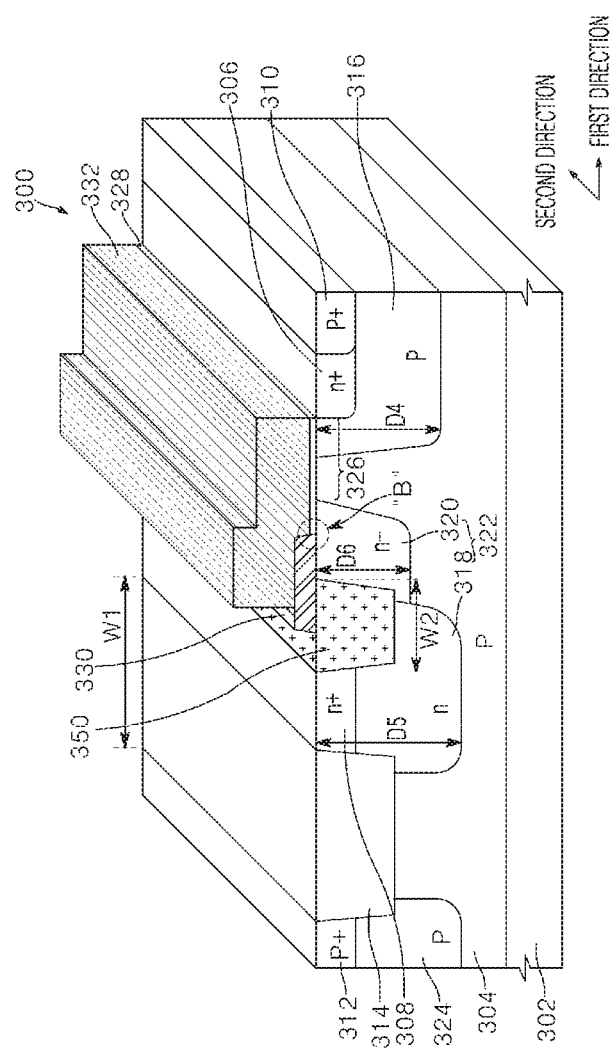
FIG. 4 is a perspective view illustrating a power integrated device according to yet another embodiment.

FIG. 4 is a perspective view illustrating a power integrated device 300 according to yet another embodiment. Referring to FIG. 4, the power integrated device 300 may include a semiconductor layer 304 of a first conductivity type, for example, a P-type semiconductor layer which is disposed on a substrate 302. In some embodiments, the P-type semiconductor layer 304 may be a material layer grown by an epitaxial process. Alternatively, the P-type semiconductor layer 304 may be provided by implanting impurity ions into a semiconductor substrate. If the substrate 302 is a semiconductor substrate having the first conductivity type that is, the P-type, the substrate 302 may serve as the P-type semiconductor layer 304. The P-type semiconductor layer 304 may be a silicon layer.

A source region 306 and a drain region 308 heavily doped with impurities of a second conductivity type, for example, an N-type source region and an N-type drain region may be disposed in an upper portion of the P-type semiconductor layer 304 spaced apart from each other in a first direction. Each of the N-type source region 306 and the N-type drain region 308 may extend in a second direction across the first direction to have a stripe shape. A body contact region 310 heavily doped with P-type impurities may be disposed at one side of the N-type source region 306. One sidewall of the N-type source region 306 may contact one sidewall of the P-type body contact region 310.

A contact region 312 heavily doped with P-type impurities may be disposed in an upper portion of the P-type semiconductor layer 304 spaced apart from the N-type drain region 308 in the first direction.

A trench isolation layer 314 may be disposed between the P-type contact region 312 and the N-type drain region 308. The trench isolation layer 314 may be disposed to electrically isolate the power integrated device 300 from other devices formed in other regions of the substrate 302. In addition, the trench isolation layer 314 may be disposed to electrically isolate some impurity junction regions constituting the power integrated device 300 from each other. More specifically, the trench isolation layer 314 may have a first width W1 in the first direction that is sufficient to electrically isolate some impurity junction regions of the power integrated device 300.

The N-type source region 306 and the P-type body contact region 310 may be surrounded by a P-type body region 316 that is disposed in the P-type semiconductor layer 304. The P-type body region 316 may have a first junction depth D4.

The N-type drain region 308 may be surrounded by the trench isolation layer 314, a second field insulation plates 350, and a drift region 322. The drift region 322 is disposed in the P-type semiconductor layer 304 to have the same conductivity type as the N-type drain region 308. The P-type contact region 312 may be surrounded by a well region 324 that is disposed in the P-type semiconductor layer 304 to have the same conductivity type as the P-type contact region 312.

The drift region 322 may include a first N-type drift region 318 and a second N-type drift region 320. The first N-type drift region 318 may be disposed in an upper portion of the P-type semiconductor layer 304, contact a bottom surface of the N-type drain region 308, and have a second junction depth D5. The second N-type drift region 320 may be disposed in an upper portion of the P-type semiconductor layer 304, is in contact with one sidewall of the first N-type drift region 318, and is spaced apart from the P-type body region 316 in the first direction.

The second N-type drift region 320 may have a third junction depth D6. The second junction depth D5 may be greater than the third junction depth D6. The first junction depth D4 of the P-type body region 316 may be less than the second junction depth D5 and may be greater than the third junction depth D6.

An impurity concentration of the first N-type drift region 318 may be lower than an impurity concentration of the N-type drain region 308. An impurity concentration of the second N-type drift region 320 may be lower than an impurity concentration of the first N-type drift region 318. In some embodiments, the impurity concentration of the second N-type drift region 320 may be within the range of about 40% to about 70% of the impurity concentration of the first N-type drift region 318. The impurity concentration in the vicinity of an interface between the first and second N-type drift regions 318 and 320 may exhibit a graded profile. That is, the impurity concentration may be linearly reduced from the first N-type drift region 318 toward the second N-type drift region 320. An upper portion of the P-type semiconductor layer 304 between the N-type source region 306 and the second N-type drift region 320 may correspond to a channel region 326.

A gate insulation layer 328 may be disposed on the channel region 326 between the N-type source region 306 and the second N-type drift region 320. The gate insulation layer 328 may extend onto the second N-type drift region 320 by a certain length. A first field insulation plate 330 may be disposed on a top surface of the first N-type drift region 318 and a top surface of the second N-type drift region 320. A second field insulation plate 350 may be disposed on the first and second N-type drift regions 318 and 320. The first field insulation plate 330 may have a planar structure. The second field insulation plate 350 may have a trench structure.

The first and second field insulation plates 330 and 350 may vertically overlap with each other. The first field insulation plate 330 may extend from over a top surface of the second N-type drift region 320 to over a top surface of the second field insulation plate 350. For example, a bottom surface of the first field insulation plate 330 may be located at the same horizontal level as the top surface of the second N-type drift region 320 and the top surface of the second field insulation plate 350.

One sidewall of the first field insulation plate 330 may contact one sidewall of the gate insulation layer 328. Both sidewalls of the second field insulation plate 350 may contact the N-type drain region 308 and the second N-type drift region 320, respectively.

The second field insulation plate 350 may have a second width W2 in the first direction. The second width W2 may be less than the first width W1 of the trench isolation layer 314. In some embodiments, the second width W2 of the second field insulation plate 350 may be within the range of about 30% to about 50% of the first width W1 of the trench isolation layer 314.

The second field insulation plate 350 and the trench isolation layer 314 may have the same depth. In some embodiments, each of the first and second field insulation plates 330 and 350 may include an oxide layer.

A gate conductive layer 332 may be disposed on the gate insulation layer 328. In an embodiment, the gate conductive layer 332 may vertically overlap the entire portion of the channel region 326 and a first portion of the second N-type drift region 320 adjacent to the channel region 326. A sidewall of the gate conductive layer 332 may be self-aligned with a sidewall of the N-type source region 306 adjacent to the channel region 326.

The gate conductive layer 332 may extend onto a top surface of the first field insulation plate 330 to cover a portion of the first field insulation plate 330. Thus, the gate conductive layer 332 may also vertically overlap a second portion of the second N-type drift region 320 and a portion of the second field insulation plate 350 adjacent to the second N-type drift region 320. The second portion of the second N-type drift region 320 may horizontally extend from the first portion of the second N-type drift region 320.

Figure 5:
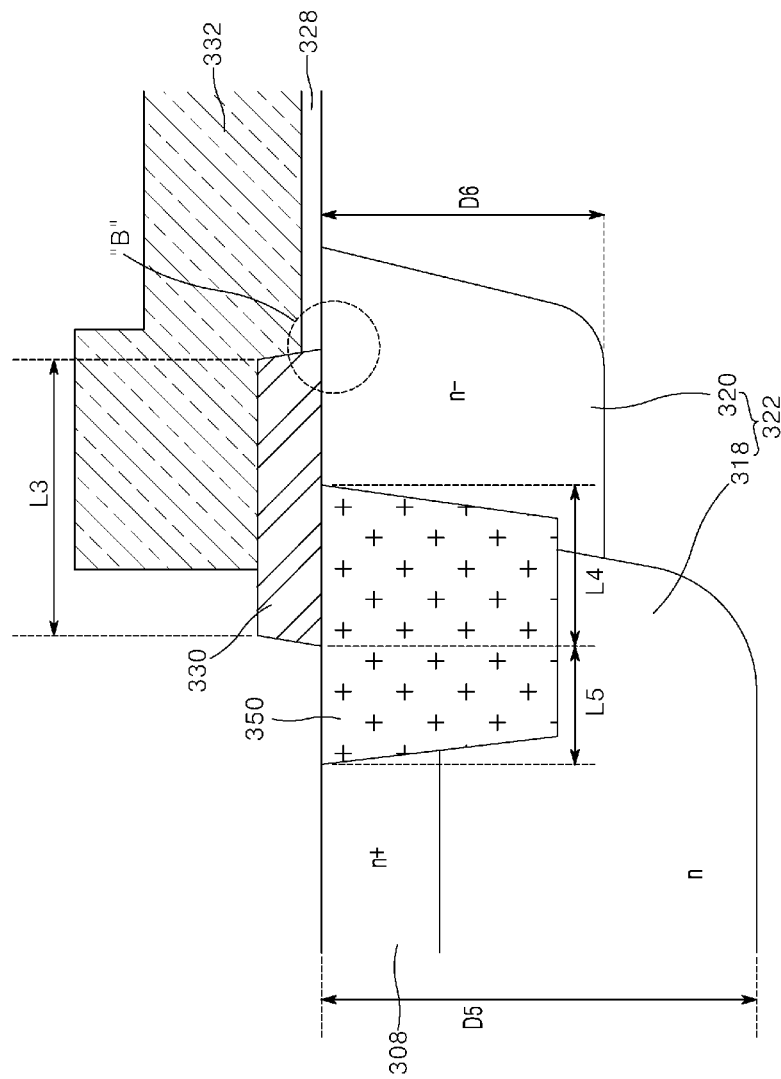
FIG. 5 is an enlarged cross-sectional view illustrating a first field insulation plate portion and a second filed insulation plate portion of the power integrated device shown in FIG. 4.

FIG. 5 is an enlarged cross-sectional view illustrating the first and second field insulation plates 330 and 350 and some regions adjacent to the first and second field insulation plates 330 and 350 shown in FIG. 4. In FIG. 5, the same reference numerals as used in FIG. 4 denote the same elements.

As illustrated in FIG. 5, an interface portion "B" between the gate insulation layer 328 and the first field insulation plate 330 may be disposed on the second N-type drift region 320, and an electric field may be concentrated at the interface portion "B". The second N-type drift region 320 may have a relatively low impurity concentration to alleviate an electric field concentration in the interface portion "B". Moreover, since the second field insulation plate 350 having a trench structure is disposed to overlap with a portion of the first field insulation plate 330 having a planar structure, a drain junction breakdown voltage (BVdss) of the power integrated device 300 may increase.

Thus, it may be possible to reduce a length of the first field insulation plate 330, which is measured in the first direction, by such an amount that the increment of the drain junction breakdown voltage due to the second field insulation plate 350.

That is, the power integrated device 300 may be designed so that a length L3 of the first field insulation plate 330 in the first direction is less than lengths of the field insulation plates 130 and 230 of the power integrated devices 100 and 200 described with reference to FIGS. 1 and 3 without degradation of the drain junction breakdown voltage. In such a case, a drift length of carriers in a region between the N-type source region 306 and the N-type drain region 308 may be reduced, lowering an on-resistance value of the power integrated device 300.

In some embodiments, a length L4 of an overlap region between the first and second field insulation plates 330 and 350 in the first direction may be substantially equal to or greater than a length L5 of the second field insulation plate 350 in the first direction that does not overlap with the first field insulation plate 330. For example, a first region of the second field insulation plate 350 overlapping with the first field insulation plate 330 has a first length corresponding to the length L4, in the first direction which extends from the source region 306 toward the drain region 308. A second region of the second field insulation plate 350 non-overlapping with the first field insulation plate 330 has a second length corresponding to the length L5, in the first direction which extends from the source region 306 toward the drain region 308. The first length L4 may be substantially equal to or greater than the second length L5. The junction depth D5 of the first N-type drift region 318 may be greater than the junction depth D6 of the second N-type drift region 320.

Figure 6:
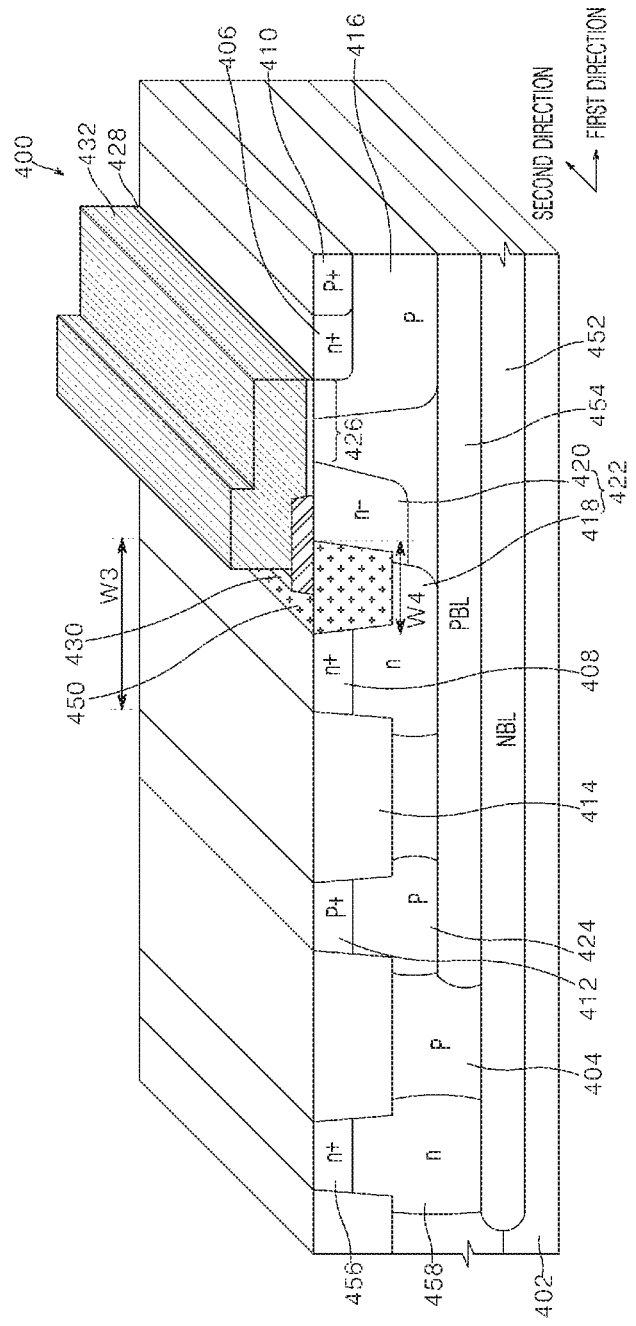
FIG. 6 is a perspective view illustrating a power integrated device according to yet another embodiment.

FIG. 6 is a perspective view illustrating a power integrated device 400 according to yet another embodiment. Referring to FIG. 6, the power integrated device 400 may include a semiconductor layer 404 of a first conductivity type. For example, a P-type semiconductor layer is disposed on a substrate 402. In some embodiments, the P-type semiconductor layer 404 may be a material layer grown by an epitaxial process. Alternatively, the P-type semiconductor layer 404 may be provided by implanting impurity ions into a semiconductor substrate.

The P-type semiconductor layer 404 may be a silicon layer. A buried layer 452 heavily doped with impurity ions of a second conductivity type, for example, an N-type buried layer, may be disposed between the substrate 402 and the P-type semiconductor layer 404. Impurities of the N-type buried layer 452 may be diffused into both of the substrate 402 and the P-type semiconductor layer 404.

A P-type buried layer 454 may be disposed in the P-type semiconductor layer 404 to cover the N-type buried layer 452. A bottom surface of the P-type buried layer 454 may contact a top surface of the N-type buried layer 452. A length of the N-type buried layer 452 in a first direction may be greater than a length of the P-type buried layer 454 in the first direction. Accordingly, one end of the N-type buried layer 452 may extend further laterally than one end of the P-type buried layer 454. Although not shown in FIG. 6, the other end of the N-type buried layer 452 may also extend further laterally than the other end of the P-type buried layer 454.

A source region 406 and a drain region 408 may be heavily doped with impurities of a second conductivity type, for example, an N-type source region. An N-type drain region 408 and an N-type source region may be disposed in an upper portion of the P-type semiconductor layer 404 spaced apart from each other in the first direction. Each of the N-type source region 406 and the N-type drain region 408 may extend in a second direction across the first direction and have a stripe shape.

A body contact region 410 heavily doped with P-type impurities may be disposed at one side of the N-type source region 406. One sidewall of the N-type source region 406 may contact one sidewall of the P-type body contact region 410. A contact region 412 heavily doped with P-type impurities and a contact region 456 heavily doped with N-type impurities may be disposed in an upper portion of the P-type semiconductor layer 404. The P-type contact region 412 may be spaced apart from the N-type drain region 408 in the first direction. The N-type contact region 456 may be spaced apart from the P-type contact region 412 in the first direction.

A trench isolation layer 414 may be disposed between the P-type contact region 412 and the N-type drain region 408 as well as between the P-type contact region 412 and the N-type contact region 456. The trench isolation layer 414 may be disposed to electrically isolate the power integrated device 400 from other devices formed in other regions of the substrate 402.

In addition, the trench isolation layer 414 may be disposed to electrically isolate some impurity junction regions constituting the power integrated device 400 from each other. More specifically, the trench isolation layer 414 may have a first width W3 in the first direction that is sufficient to electrically isolate some impurity junction regions of the power integrated device 400 from each other.

The N-type source region 406 and the P-type body contact region 410 may be surrounded by a P-type body region 416 that is disposed in the P-type semiconductor layer 404. The N-type drain region 408 may be surrounded by the trench isolation layer 414, a second field insulation plates 450, and a drift region 422. The drift region 422 is disposed in the P-type semiconductor layer 404 to have the same conductivity type as the N-type drain region 408. The P-type contact region 412 may be surrounded by a well region 424 that is disposed in the P-type semiconductor layer 404 to have the same conductivity type as the P-type contact region 412. Bottom surfaces of the P-type body region 416 and the P-type well region 424 may contact a top surface of the P-type buried layer 454. The N-type contact region 456 may be surrounded by an N-type sink region 458. A bottom surface of the N-type sink region 458 may contact a top surface of the N-type buried layer 452.

The drift region 422 may include a first N-type drift region 418 and a second N-type drift region 420. The first N-type drift region 418 may be disposed in an upper portion of the P-type semiconductor layer 404 to surround sidewalls and a bottom surface of the N-type drain region 408, and a bottom surface of the first N-type drift region 418 may contact a top surface of the P-type buried layer 454.

The second N-type drift region 420 may be disposed in an upper portion of the P-type semiconductor layer 404 to contact one sidewall of the first N-type drift region 418 and spaced apart from the P-type body region 416 by a certain distance in the first direction. A bottom surface of the second N-type drift region 420 may be spaced apart from a top surface of the P-type buried layer 454 by a certain distance. Alternatively, the bottom surface of the second N-type drift region 420 may contact the top surface of the P-type buried layer 454.

An impurity concentration of the first N-type drift region 418 may be lower than an impurity concentration of the N-type drain region 408. An impurity concentration of the second N-type drift region 420 may be lower than an impurity concentration of the first N-type drift region 418. An upper portion of the P-type semiconductor layer 404 between the N-type source region 406 and the second N-type drift region 420 may correspond to a channel region 426.

A gate insulation layer 428 may be disposed on the channel region 426 between the N-type source region 406 and the second N-type drift region 420. The gate insulation layer 428 may extend onto the second N-type drift region 420.

A first field insulation plate 430 may be disposed on a top surface of the first N-type drift region 418 and a top surface of the second N-type drift region 420. A second field insulation plate 450 may be disposed on the first and second N-type drift regions 418 and 420. The first field insulation plate 430 may have a planar structure. The second field insulation plate 450 may have a trench structure. The first and second field insulation plates 430 and 450 may vertically overlap with each other.

A bottom surface of the first field insulation plate 430 may be located at the same horizontal level as the top surface of the second N-type drift region 420 and a top surface of the second field insulation plate 450. One sidewall of the first field insulation plate 430 may contact one sidewall of the gate insulation layer 428.

Both sidewalls of the second field insulation plate 450 may contact the N-type drain region 408 and the second N-type drift region 420, respectively. The second field insulation plate 450 may have a second width W4 in the first direction. The second width W4 may be less than the first width W3 of the trench isolation layer 414. In some embodiments, the second width W4 of the second field insulation plate 450 may be within the range of about 30% to about 50% of the first width W3 of the trench isolation layer 414. The second field insulation plate 450 and the trench isolation layer 414 may have the same depth. In some embodiments, each of the first and second field insulation plates 430 and 450 may include an oxide layer.

A gate conductive layer 432 may be disposed on the gate insulation layer 428. Thus, the gate conductive layer 432 may vertically overlap with an entire portion of the channel region 426 and a portion of the second N-type drift region 420 adjacent to the channel region 426. A sidewall of the gate conductive layer 432 may be self-aligned with a sidewall of the N-type source region 406 adjacent to the channel region 426. The gate conductive layer 432 may extend onto a top surface of the first field insulation plate 430 to cover a portion of the first field insulation plate 430. Thus, the gate conductive layer 432 may also vertically overlap with another portion of the second N-type drift region 420 and a portion of the second field insulation plate 450 adjacent to the second N-type drift region 420.

As described with reference to FIGS. 4 and 5, an interface portion between the gate insulation layer 428 and the first field insulation plate 430 may be disposed on the second N-type drift region 420, and an electric field may be concentrated at the interface portion. The second N-type drift region 420 may have a relatively low impurity concentration to alleviate an electric field concentration in the interface portion between the gate insulation layer 428 and the first field insulation plate 430.

The presence of the second field insulation plate 450 having a trench structure and overlapping with a portion of the first field insulation plate 430 having a planar structure may increase a drain junction breakdown voltage (BVdss) of the power integrated device 400. It may be possible to reduce a length of the first field insulation plate 430 in the first direction by a certain dimension corresponding to the increment of the drain junction breakdown voltage (BVdss) which is due to the present of the second field insulation plate 450.

That is, the power integrated device 400 may be designed so that a length of the first field insulation plate 430 in the first direction is less than lengths of the field insulation plates 130 and 230 of the power integrated devices 100 and 200 described with reference to FIGS. 1 and 3 without degradation of the drain junction breakdown voltage. In such a case, a drift length of carriers in a region between the N-type source region 406 and the N-type drain region 408 may be reduced, lowering an on-resistance value of the power integrated device 400.

In some embodiments, a length of an overlap region between the first and second field insulation plates 430 and 450 in the first direction may be substantially equal to or greater than a length of the second field insulation plate 450 in the first direction that does not overlap with the first field insulation plate 430. A junction depth of the first N-type drift region 418 may be greater than a junction depth of the second N-type drift region 420.

A bottom surface of the first N-type drift region 418 may contact a top surface of the P-type buried layer 454. Thus, the first N-type drift region 418 may be fully depleted under a certain bias condition. For example, when the P-type contact region 412 is grounded and a positive drain voltage is applied to the N-type drain region 408, a reverse bias may be applied across a junction between the P-type buried layer 454 and the first N-type drift region 418. Thus, both of the P-type buried layer 454 and the first N-type drift region 418 may be depleted in the vicinity of the junction therebetween. Therefore, the first N-type drift region 418 may be depleted in the vicinity of the junction between the first N-type drift region 418 and the P-type buried layer 454 as well as in the vicinity of the junction between the first N-type drift region 418 and the P-type semiconductor layer 404. As a result, the first N-type drift region 418 may be instantaneously and fully depleted to improve a breakdown characteristic of the power integrated device 400.

Figure 7:
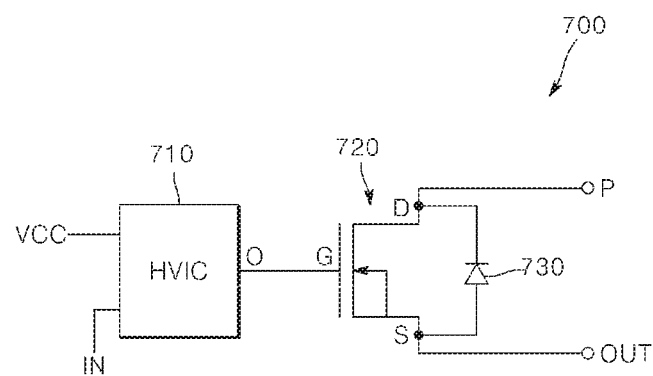
FIG. 7 is a schematic view illustrating an electronic device employing at least one of power integrated devices according to some embodiments of the present disclosure.

FIG. 7 is a schematic view illustrating an electronic device 700 employing the power integrated devices according to an embodiment. Referring to FIG. 7, the electronic device 700 may include a high voltage integrated circuit (HVIC) 710 acting as a driver circuit and a power integrated device 720 serving as a switching device. This electronic device 700 may correspond to a single phase inverter. The HVIC 710 may have a supply voltage terminal VCC, an input terminal IN and an output terminal O. The HVIC 710 may receive a power supply voltage signal through the supply voltage terminal VCC to drive internal circuit. In addition, the HVIC 710 may receive an input signal through the input terminal IN to generate an output signal. The output signal may be outputted through the output terminal O. The output terminal O may be connected to a gate terminal G of the power integrated device 720.

The power integrated device 720 may be the LDMOS transistors which are described with reference to FIGS. 1 and 6, but is not limited thereto. Thus, the power integrated device 720 may include a first field insulation plate having a planar structure. The power integrated device 720 may include a first field insulation plate having a planar structure and a second field insulation plate having a trench structure.

The power integrated device 720 may include a first drift region and a second drift region that have different impurity concentrations and different junction depths. The power integrated device 720 may also include a P-type buried layer contacting a drift region. Accordingly, an on-resistance characteristic and a breakdown characteristic of the power integrated device 720 may be improved. As a result, if the aforementioned power integrated device 720 is employed in the electronic device 700, an operation voltage of the electronic device 700 may increase and an operation speed of the electronic device 700 may be improved.

The power integrated device 720 may include a drain terminal D connected to a power supply terminal P to which a power supply voltage is applied. Moreover, the power integrated device 720 may include a source terminal S connected to an output terminal OUT. A freewheeling diode 730 may be coupled in anti-parallel between the drain terminal D and the source terminal S of the power integrated device 720. The output signal of the HVIC 710 may be applied to the gate terminal G of the power integrated device 720 to turn on or turn off the power integrated device 720. If the electronic device 700 is a multi-phase inverter, the electronic device 700 may be configured to include a plurality of HVICs 710 and a plurality of power integrated devices 720. In such a case, the number of the HVICs 710 and the number of the power integrated devices 720 may be equal to the number of the phases.

Figure 8:
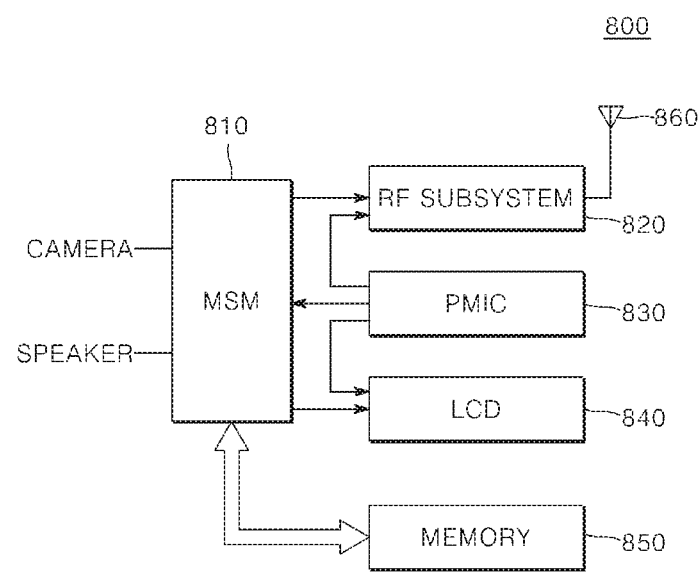
FIG. 8 is a block diagram illustrating an electronic system employing at least one of power integrated devices according to some embodiments of the present disclosure.

FIG. 8 is a block diagram illustrating an electronic system 800 employing the power integrated devices according to an embodiment. Referring to FIG. 8, the electronic system 800 may be a mobile system and may include a mobile station modem (MSM) 810, a radiofrequency (RF) subsystem 820, a power management integrated circuit (PMIC) 830, a display 840 such as a liquid crystal display (LCD), and a memory 850.

The MSM 810 may include a processor for controlling overall operations of the electronic system 800, a digital signal processor (DSP) for processing audio signals and video signals, a modem for communication, and a driver.

The RF subsystem 820 may be used to stably set a frequency band available for the electronic system 800 and may be used to convert an analog signal into a digital signal or vice versa.

The display 840 may be used as an output unit of the electronic system 800. The memory 850 may include a mobile dynamic random access memory (DRAM) and a NAND flash memory that store data which are used in operation of the electronic system 800. The memory 850 may communicate with the MSM 810 through a bidirectional bus.

The electronic system 800 may further include a camera, a speaker and an antenna 860. The camera and the speaker may be controlled by the MSM 810. Images captured by the camera may be stored in the memory 850. Image data stored in the memory 850 may be outputted through the display 840. The RF subsystem 820 may convert signals received through the antenna 860 into analog signals or digital signals. Audio signals of the signals received through the antenna 860 may be outputted through the speaker.

The PMIC 830 may receive a power supply voltage from an external device or a battery to supply the power supply voltage to the various internal elements of the electronic system 800. Thus, the PMIC 830 may include a power management circuit that employs at least one of the power integrated devices such as, those described with reference to FIGS. 1 to 6, as a switching device. In some embodiments, the power management circuit may be configured to include a regulator, an inverter, a converter or a driver.

The embodiments of the present disclosure have been disclosed above for illustrative purposes.

What is claimed is:

1. An integrated device comprising:
   a semiconductor layer having a first conductivity type;
   a source region having a second conductivity type;
   a drift region having the second conductivity type, disposed in the semiconductor layer, and spaced apart from the source region by a channel region;
   a drain region having the second conductivity type and disposed in an upper portion of the drift region;
   a gate insulation layer disposed over the channel region and extending over the drift region;
   a first field insulation plate disposed over the drift region, contacting a sidewall of the gate insulation layer, and having a planar structure;
   a second field insulation plate extending from under the first field insulation plate into the drift region and having a trench structure; and
   a gate conductive pattern disposed over the gate insulation layer,
   wherein the gate conductive pattern extends over the first field insulation plate,
   wherein the drift region includes a first drift region disposed in the semiconductor layer and covering a bottom surface of the drain region, and a second drift region disposed in the semiconductor layer between the channel region and the first drift region, and
   wherein a junction depth of the first drift region is greater than a junction depth of the second drift region.

2. The integrated device of claim 1,
   wherein the second drift region contacts a sidewall of the first drift region and has an impurity concentration lower than an impurity concentration of the first drift region.

3. The integrated device of claim 2, wherein the impurity concentration of the second drift region is within the range of about 40% to about 70% of the impurity concentration of the first drift region.

4. The integrated circuit device of claim 3, wherein the impurity concentration of the second drift region gradually reduces from an interface between the first and second drift region toward the opposite side of the interface.

5. The integrated device of claim 1, wherein an interface between the gate insulation layer and the first field insulation plate is disposed over the second drift region.

6. The integrated device of claim 1, further comprising:
a body region having the first conductivity, disposed in the semiconductor layer, surrounding the source region, and spaced apart from the second drift region.

7. The power integrated device of claim 1, further comprising:
a first buried layer having the second conductivity and disposed in the semiconductor layer; and
a second buried layer having the first conductivity, disposed between the first buried layer and the first drift region.

8. The power integrated device of claim 7, wherein a top surface and a bottom surface of the second buried layer are in contact with a bottom surface of the first drift region and a top surface of the first buried layer, respectively.

9. The power integrated device of claim 8,
wherein a first region of the second field insulation plate overlapping with the first field insulation plate has a first length when measured in a first direction which extends from the source region toward the drain region;
wherein a second region of the second field insulation plate not overlapping with the first field insulation plate has a second length when measured in the first direction; and
wherein the first length is substantially equal to or greater than the second length.

10. The power integrated device of claim 8, wherein a bottom surface of the first field insulation plate is located substantially at the same level as a top surface of the drift region and a top surface of the second field insulation plate.

11. The power integrated device of claim 8, wherein each of the first and the second field insulation plates includes an oxide layer.

* * * * *